(12) United States Patent
Ho et al.

(10) Patent No.: US 8,765,329 B2
(45) Date of Patent: Jul. 1, 2014

(54) SUB-RESOLUTION ROD IN THE TRANSITION REGION

(75) Inventors: Jeng-Shiun Ho, Hsin-Chu (TW); Luke Lo, Pingjhen (TW); Ting-Chun Liu, Xizhi (TW); Min-Hung Cheng, Hsinchu (TW); Jing-Wei Shih, Banqiao (TW); Wen-Han Chu, Hsinchu (TW); Cheng-Cheng Kuo, Hsinchu County (TW); Hua-Tai Lin, Hsin-Chu (TW); Tsai-Sheng Gau, HsinChu (TW); Ru-Gun Liu, Hsinchu (TW); Yu-Hsiang Lin, Hsinchu (TW); Shang-Yu Huang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 61 days.

(21) Appl. No.: 12/940,230

(22) Filed: Nov. 5, 2010

(65) Prior Publication Data
US 2012/0115073 A1    May 10, 2012

(51) Int. Cl.
*G03F 1/36* (2012.01)
(52) U.S. Cl.
USPC .......................................................... 430/5
(58) Field of Classification Search
CPC ...................................................... G03F 1/36
USPC .............................................................. 430/5
See application file for complete search history.

(56) References Cited

U.S. PATENT DOCUMENTS

| 6,413,683 | B1* | 7/2002 | Liebmann et al. | ................ 430/5 |
| 7,713,824 | B2 | 5/2010 | Sarma et al. | |
| 2004/0038135 | A1* | 2/2004 | Griesinger et al. | ............... 430/5 |
| 2009/0119634 | A1 | 5/2009 | Sweis | |

FOREIGN PATENT DOCUMENTS

EP    1494071 A2    5/2005

\* cited by examiner

*Primary Examiner* — Mark F Huff
*Assistant Examiner* — John S Ruggles
(74) *Attorney, Agent, or Firm* — Haynes and Boone, LLP

(57) ABSTRACT

The present disclosure provides a photomask. The photomask includes a first integrated circuit (IC) feature formed on a substrate; and a second IC feature formed on the substrate and configured proximate to the first IC feature. The first and second IC features define a dense pattern having a first pattern density. The second IC feature is further extended from the dense pattern, forming an isolated pattern having a second pattern density less than the first pattern density. A transition region is defined from the dense pattern to the isolated pattern. The photomask further includes a sub-resolution rod (SRR) formed on the substrate, disposed in the transition region, and connected with the first IC feature.

17 Claims, 9 Drawing Sheets

US 8,765,329 B2

SUB-RESOLUTION ROD IN THE TRANSITION REGION

BACKGROUND

A semiconductor wafer is processed by a semiconductor manufacturer to form various integrated circuits (IC) in different regions of the wafer. Pattern density variations over the different regions causes various issues including critical dimension (CD) variation or CD uniformity. When the semiconductor fabrication scales down to advanced technologies, such as 45 nm, 32 nm, or 28 nm, the IC features are more sensitive to the CD variations and uniformity. For example, dense lines and isolated lines are common in IC layout and cannot be avoided by the design rules. The sudden variation of local pattern density surrounded may cause the distortion of IC feature, referred to as a necking or bridge issue. Due to the limited surrounding, the use of scattering bars is often ineffective to reduce this issue. Re-targeting the width of the IC feature is also limited by side space availability. Therefore, there is a need of a new integrated circuit pattern and the method masking the same to address the issue.

SUMMARY

The present disclosure describes a photomask. The photomask includes a first integrated circuit (IC) feature formed on a substrate and a second IC feature formed on the substrate and configured proximate to the first IC feature. The first and second IC features define a dense pattern having a first pattern density. The second IC feature is further extended from the dense pattern to form an isolated pattern having a second pattern density less than the first pattern density. A transition region is defined from the dense pattern to the isolated pattern. The photomask further includes a sub-resolution rod (SRR) formed on the substrate, disposed in the transition region, and connected with the first IC feature.

In one embodiment, the second IC feature includes a first width cd greater than a printable width defined as a minimum dimension printable to a photoresist layer during a lithography patterning process and the SRR includes a second width W less than the printable width. In another embodiment, the SRR includes a length L equal to or greater than 0.8 times of the first width cd. In another embodiment, the SRR includes more than one widths where at least one width is less than the printable width. The dense pattern includes a first spacing sp1 between the first and second IC features, the first spacing sp1 being less than or equal to 2*cd. In another embodiment, the length L is greater than or equal to 1.2*cd. A second spacing sp2 is defined in the transition region and spans from the isolated pattern of the second IC feature to a nearby IC feature along a direction perpendicular to the second IC feature, the second spacing sp2 being greater than or equal to 2*cd. In another embodiment, the SRR includes a first end and a second end, the first end being connected to the first IC feature and the second end being spaced away from a nearby feature with a distance greater than the first width. In yet another embodiment, the photomask further includes an additional SRR disposed in the transition region, proximate to the SRR, and connected with the first IC feature. The additional SRR is similar to the SRR in width, length, and orientation according to various embodiment. In yet another embodiment, the SRR is aligned with the second IC feature in a same direction.

The present disclosure also describes an integrated circuit (IC) pattern formed on a substrate. In one embodiment, the IC pattern includes a first IC feature and a second IC feature including a first segment and a second segment. The first segment and the first IC feature are configured proximate to each other and define a dense pattern having a first pattern density. The second segment forms an isolated region having a second pattern density less than the first pattern density. A transition region is defined from the dense pattern to the isolated pattern. The IC pattern further includes at least one sub-resolution rod (SRR) disposed in the transition region, and connected to one of the first and second IC features. The dense pattern includes a spacing between the first IC feature and the first segment.

In one embodiment, the substrate is a photomask used to pattern a semiconductor wafer in a lithography process. In another embodiment, the SRR is perpendicular to the first IC feature. In another embodiment, the SRR includes a first end connected to the first IC feature and a second end connected to a third IC feature. In yet another embodiment, the SRR is connected to the second segment of the second IC feature; the second IC feature includes a width cd; and the SRR includes a length greater than or equal to 1.2*cd. In yet another embodiment, the SRR is perpendicular to the second IC feature.

The present disclosure also describes a method for lithography patterning. In one embodiment, the method includes forming a radiation-sensitive resist layer on a device substrate and providing a photomask having a pattern. The photomask pattern includes a first IC feature and a second IC feature configured proximate to each other and defined a dense pattern having a first pattern density, the second IC feature being further extended to form an isolated pattern having a second pattern density less than the first pattern density; and a sub-resolution rod (SRR) disposed in a transition region, and connected with one of the first and second IC features, wherein the transition region is an area defined from the dense pattern to the isolated pattern. The method further includes exposing the radiation-sensitive resist layer using a radiation energy projected to the device substrate through the photomask, forming an image of the pattern without SRR on the radiation-sensitive resist layer.

In one embodiment, the exposing of the radiation-sensitive resist layer is implemented in a photolithography tool and the radiation-sensitive layer includes a photoresist layer. In another embodiment, the method further includes post-exposure baking the radiation-sensitive resist layer after the exposing; and thereafter developing the radiation-sensitive resist layer, forming a patterned radiation-sensitive resist layer. In yet another embodiment, the forming of the radiation-sensitive resist layer on the device substrate includes forming the radiation-sensitive resist layer on a semiconductor wafer.

The present disclosure also describes an IC design method. In one embodiment, the method includes performing an IC design and forming an IC layout. The method further includes adding one or more SRRs disposed in the transition regions and connected to adjacent IC features of the IC layout. The SRRs are similar to those SRRs of FIGS. 1 through 15 in various embodiments, forming an IC pattern for mask making. As the SRRs can effectively adjust the pattern density of the transition, prevent the necking issue of a neighboring IC feature, or increase the depth of focus according various embodiments, there is no need to amend the design rules, retarget the IC features, or shift the IC features. In one embodiment, the method further includes adding other assist features, such as scattering bars, for optical proximity correction (OPC), referred to as OPC features. In another embodiment, the SRRs are added to the IC layout with OPC features at a same stage, such as after the IC design tapeout and before the mask making. In yet another embodiment, the IC pattern having SRRs is used to fabricate a photomask by a mask making tool, such as an electron-beam (e-beam) tool.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
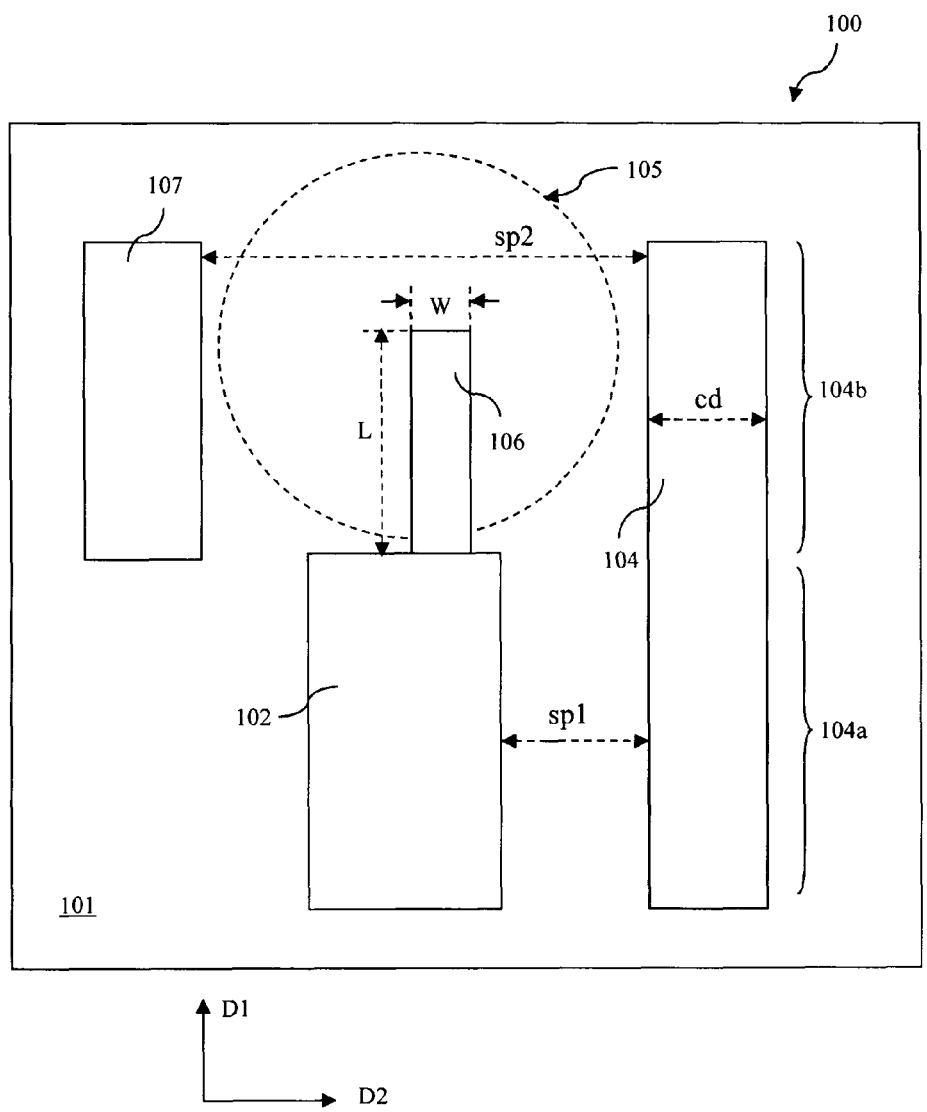
FIG. 1 is a schematic view of an integrated circuit (IC) pattern constructed according to aspects of the present disclosure in one embodiment.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. It will be understood that directional label D1 and D2 are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

FIG. 1 is a top view of an integrated circuit (IC) pattern 100 constructed according to aspects of the present disclosure. In one embodiment, the IC pattern 100 is a portion of a photomask (or mask or reticle) utilized to fabricate one or more device substrates (or wafers) during a photolithography patterning process. In furtherance of the present embodiment, the photomask further includes a transparent substrate (or photomask substrate) 101, such as a fused quartz substrate. The IC pattern 100 is fabricated using a binary technology or phase-shift mask (PSM) technology according to various embodiments.

The IC pattern 100 includes a first IC feature 102 and a second IC feature 104 formed on the photomask substrate 101. In various embodiments, the first and second IC features corresponds to metal lines, polysilicon gates or other suitable circuit features to be formed on one or more device substrates during a lithography process. The first and second IC features are configured proximate to each other. In the present embodiment, the second IC feature 104 includes a first width labeled as "cd". The first width is greater than a printable width, defined as a minimum dimension printable to a photoresist layer during a lithography patterning process that transfers the IC pattern from the photomask to the semiconductor wafers. In the present example, the second IC feature 104 is a straight line.

Similarly, the first IC features include a width greater than the printable width. The second IC feature 104 further includes a first segment 104a, also referred to as dense segment. The first segment 104a of the second IC feature and the first IC feature 102 defines a dense pattern having a dense pattern density (also referred to as first pattern density). The dense pattern further defines a first spacing "sp1" between the first segment 104a and the first IC feature 102. In one embodiment, the first spacing sp1 is less than or equal to the twice of the first width, formulated as sp1<=2*cd.

The second IC feature 104 further includes a second segment 104b extended from the first segment 104a in the dense pattern. The second segment 104b is also referred to as isolated segment. The second segment 104b of the second IC feature 104 defines an isolated pattern having an isolated pattern density (also referred to as second pattern density). The second pattern density of the isolated pattern is substantially lower than the first pattern density of the dense pattern.

A transition region 105 is defined in an area spanned from the dense pattern to the isolated pattern as illustrated in FIG. 1. The transition region 105 has a low pattern density, causing the CD variation of the isolated pattern and variation of the depth of focus (DOF). Thus, the processing window is limited and the lithography patterning is degraded accordingly. The existing scattering bars are designed to provide optical proximity correction (OPC) and are ineffective to tune the pattern density in the transition region 105, especially the transition region adjacent the first IC feature 102.

The IC pattern 100 includes a sub-resolution rod (SRR) 106 disposed in the transition region 105 and connected to the first IC feature 102. The SRR 106 includes a second width "W" less than the printable width associated with the lithography patterning process to transfer the IC pattern 100 from the photomask to the device substrate. The SRR 106 includes a length "L" extended from one end connected to the first IC feature 102 to the other end. The length L of the SRR 106 is long enough to effectively increase the pattern density of the transition region 105, especially an area of the transition region adjacent the first IC feature 102. In one embodiment, the length L of the SRR 106 is greater than or equal to 0.8 time of the first width cd, formulated as L>=0.8*cd. In another embodiment, the length L of the SRR 106 is greater than or equal to 1.2 times of the first width cd, formulated as L>=1.2*cd. In the present embodiment, the SRR 106 has a geometry of a rectangle.

A second spacing "sp2" is defined in the transition region and is spanned from the second segment 104b to a nearby IC feature 107 along a direction perpendicular to the second IC feature 104 as illustrated in FIG. 1. In one embodiment, the second spacing sp2 is greater than or equal to the twice of the first width, formulated as sp2>=2*cd.

In the present embodiment, the second IC feature 104 and the SRR 106 are aligned in the first direction "D1." The length L of the SRR 106 is defined in the first direction D1. In furtherance of the present embodiment, the first and second widths "cd" and "W" are defined in a second direction "D2." The first spacing sp1 and the second spacing sp2 are defined in the second direction D2 as well. The second segment 104b of the second IC feature 104 is extended from the first segment 104a in the first direction.

Figure 2:
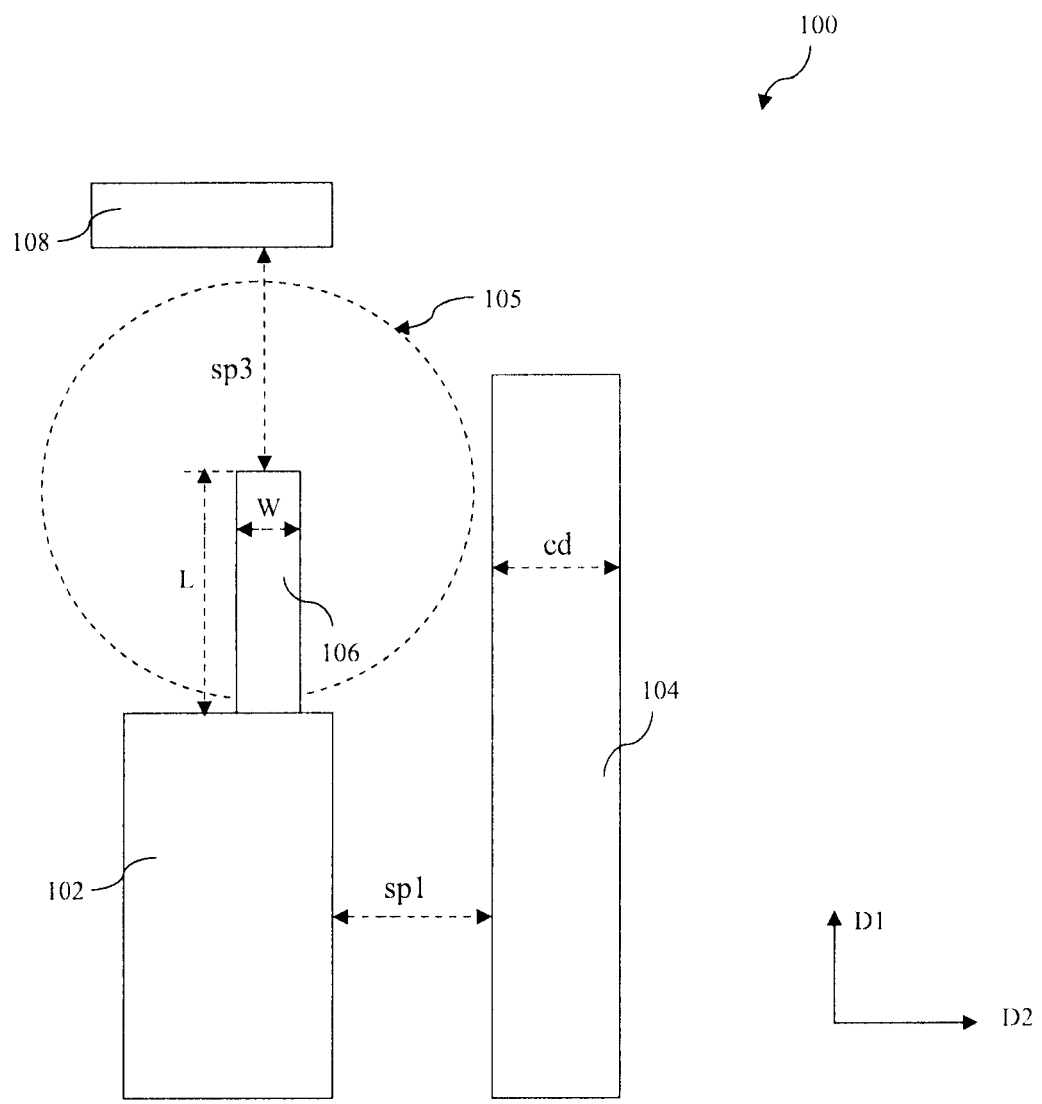
FIGS. 2 through 15 provide schematic views of an IC pattern constructed according to aspects of the present disclosure in various embodiments.

The IC pattern 100 has various embodiments and alternatives without departure from the spirit of the present disclosure. For example, the SRR includes more than one widths where at least one width is less than the printable width. FIG. 2 provides another embodiment of the IC pattern 100 constructed according to various aspects of the present disclosure. The IC pattern 100 of FIG. 2 includes a third IC feature 108 distanced away from the first and second IC features. The third IC feature 108 is a metal line, polysilicon gate or other suitable circuit feature to be formed on one or more device substrates during a lithography process. The transition region 105 is defined adjacent the first, second and third IC features (102, 104 and 108). A third spacing "sp3" is defined in the transition region 105 and spanned from the distant end of the SRR 106 to the third IC feature 108 as illustrated in FIG. 2. The third spacing is equal to or greater than the first width, formulated as sp3>=cd. The third spacing is aligned along the first direction D1 in the present embodiment. In an alternative embodiment, the first width cd is defined as the width of the first IC feature 102. In this case, the above dimensional relationships related to the first width cd remain valid.

Figure 3:
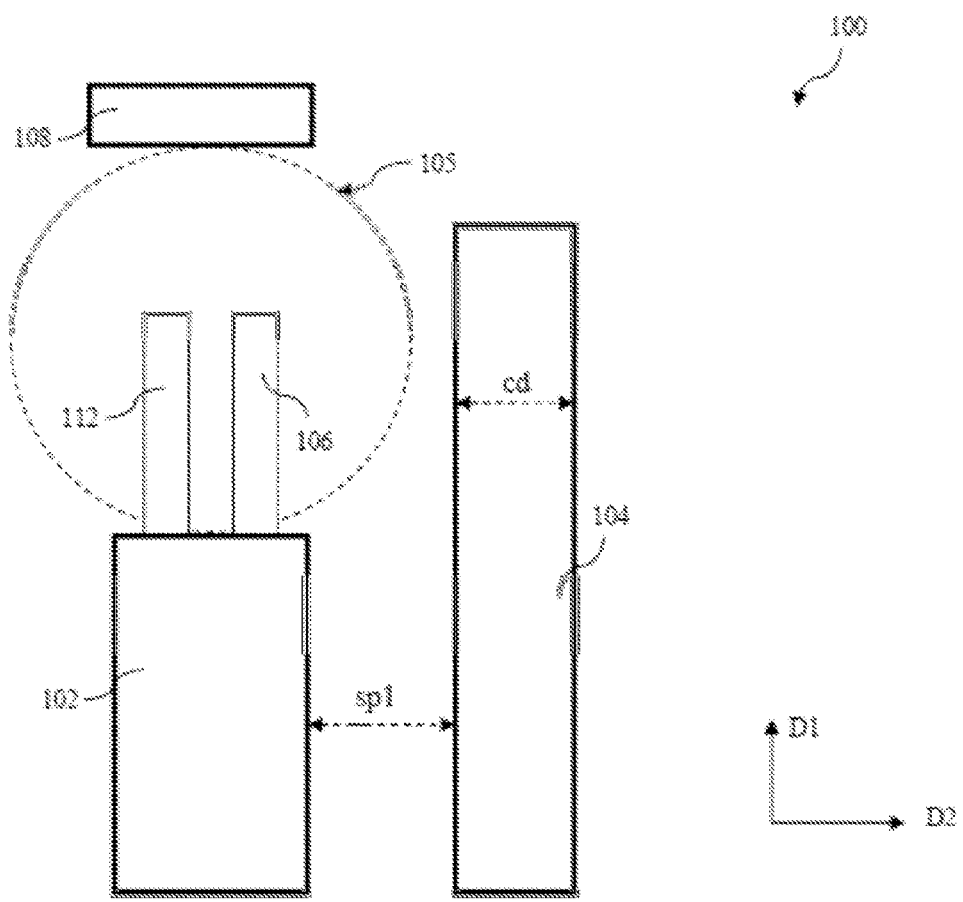

FIG. 3 provides yet another embodiment of the IC pattern 100 constructed according to various aspects of the present disclosure. The IC pattern 100 of FIG. 3 includes a second sub-resolution rod (second SRR) 112 disposed in the transition region 105 and connected to the first IC feature 102. The second SRR 112 includes a width less than the printable width. The second SRR 112 is configured proximate to the first SRR 106 and is added to further adjust the pattern density of the transition region 105. In the present embodiment, the first and second SRRs 106 and 112 are aligned in the first direction D1. In another embodiment, the second SRR 112 is substantially similar to the first SRR 106 in terms of the width and length.

In yet another embodiment, the IC pattern 100 includes a plurality of sub-resolution rods (SRRs) disposed in the transition region 105 and connected to the first IC feature 102. Each of the plurality of SRRs has a width less than the printable width. The number of SRRs is optimized to effectively adjust the pattern density of the transition region 105. In one example, the plurality of SRRs are configured parallel with each other and positioned periodically with a pitch defined as the periodic distance from the center of a SRR to a nearby SRR. In yet another embodiment, the pitch of SRRs is optimized to effectively adjust the pattern density of the transition region 105.

Figure 4:
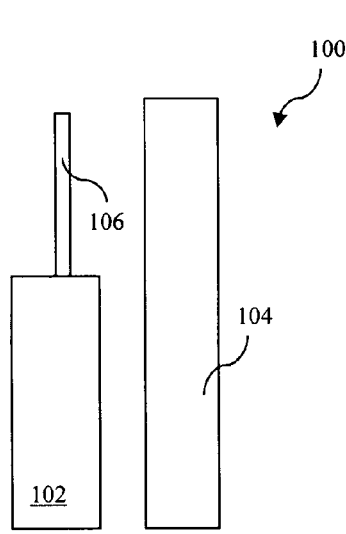
Figure 5:
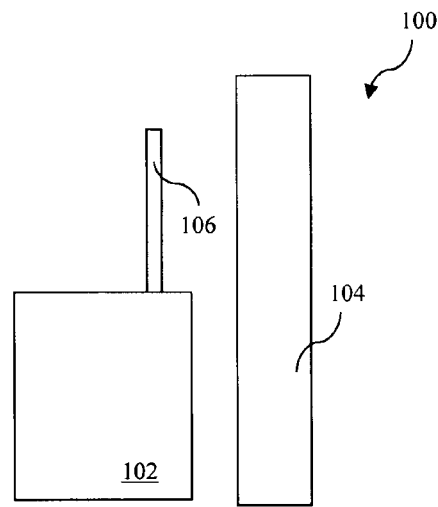
Figure 6:
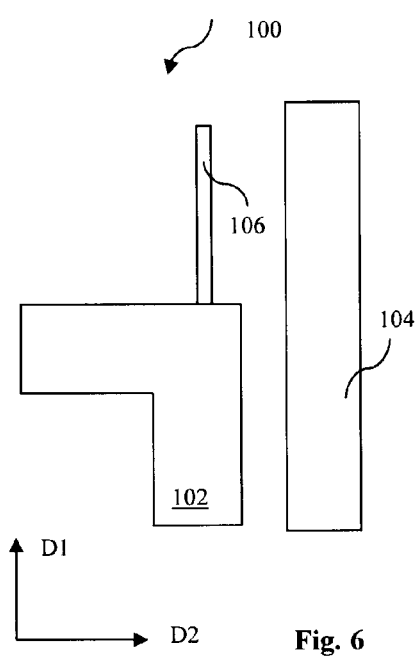

In an alternative embodiment, the IC pattern 100 is an IC design pattern before formed on a photomask. FIGS. 4 to 6 provide various embodiments of the IC pattern 100 constructed according to various aspects of the present disclosure. In FIG. 4, the first IC feature 102 is a rectangle. In FIG. 5, the first IC feature 102 is a square. In FIG. 6, the first IC feature 102 is L-shaped. Particularly, the first IC feature 102 includes a first section aligned in the first direction D1 and a second section aligned in the second direction D2. The SRR 106 contacts the first section of the first IC feature 102.

Figure 7:
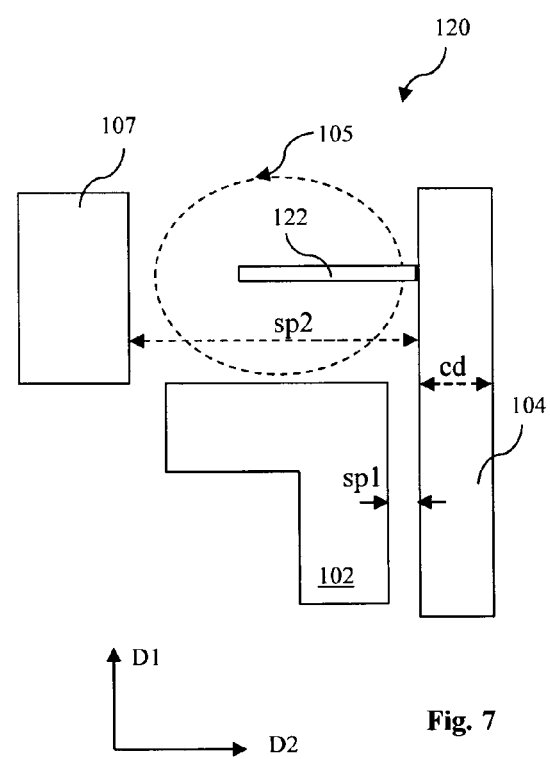

FIG. 7 provides an embodiment of an IC pattern 120 constructed according to various aspects of the present disclosure. The IC pattern 120 includes a first IC feature 102 and a second IC feature 104, defining a transition region 105. The IC pattern 120 includes a SRR 122 disposed in the transition region 105 and connected to the second IC feature 104. In furtherance of the present embodiment, the SRR 122 is perpendicular to the second IC feature 104. Particularly, the second IC feature 104 is aligned in the first direction D1 while the SRR 122 is aligned in the second direction D2. The IC pattern 120 is similar to the IC pattern 100, such as the one of FIG. 6, except for the SRR is configured differently. For example, the SRR 122 includes a length L greater than the first width cd of the second IC feature 104. In another example, the first spacing sp1 defined between the first and second IC features (102 and 104) is less than or equal to the twice of the first width cd formulated as sp1<=2*cd. In yet another example, the second spacing sp2 defined in the transition region 105 between the second IC feature 102 and a nearby IC feature 107 is greater than or equal to the twice of the first width cd, formulated as sp2>=2*cd. In an alternative embodiment, the IC pattern 120 includes a plurality of SRRs 122 disposed in the transition region 105, connected to the second IC feature 104, and perpendicular to the second IC feature 104.

Figure 8:
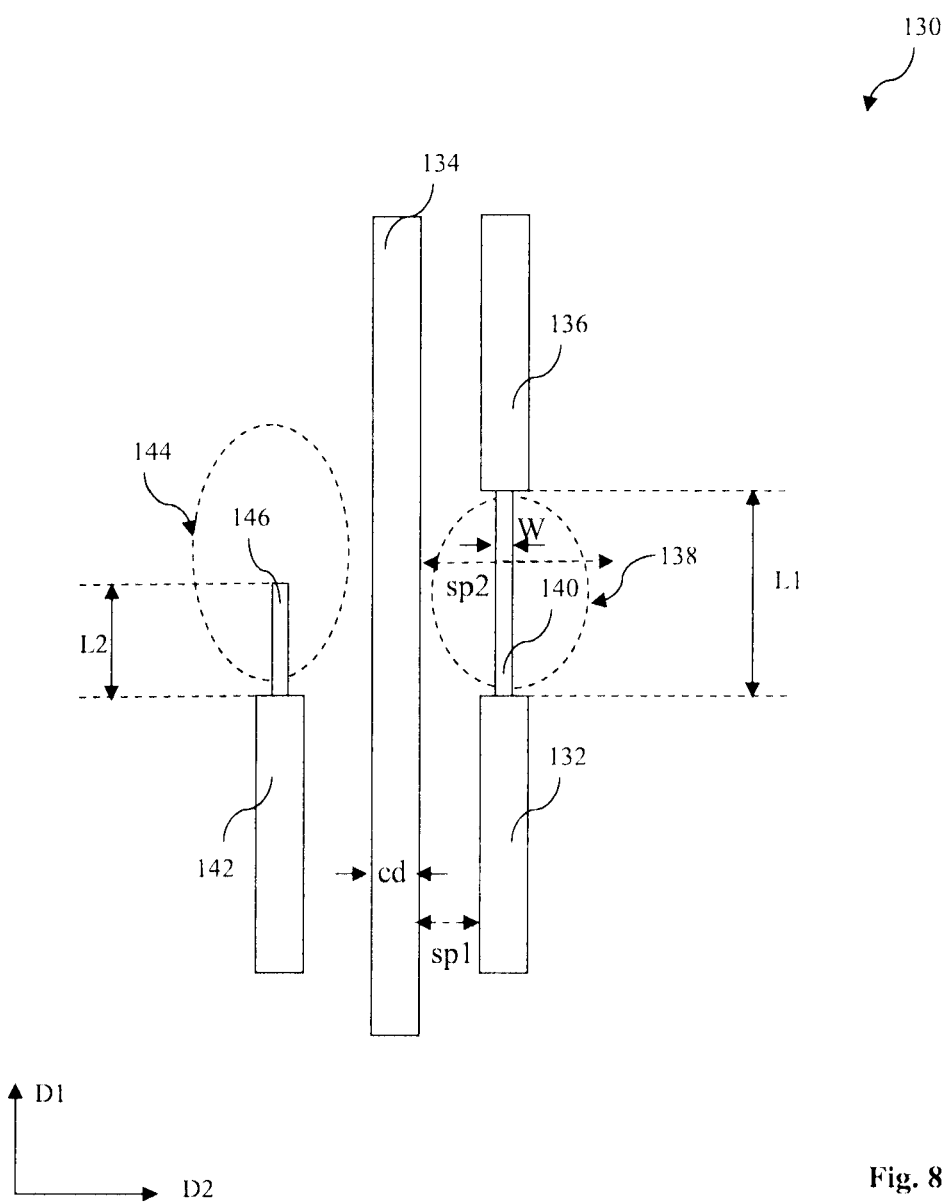

FIG. 8 provides another embodiment of an IC pattern 130 constructed according to various aspects of the present disclosure. The IC pattern 130 includes a first IC feature 132 and a second IC feature 134. The IC pattern 130 further includes a third IC feature 136. The first IC feature 132 and a first segment of the second IC feature 134 forms a first dense pattern. The first IC feature 132 and a second segment of the second IC feature 134 forms a second dense pattern. A third segment of the second IC feature interposed between the first and second segments forms an isolated pattern. The first dense pattern, the second dense pattern and the isolated pattern define a first transition region 138. A first SRR 140 is disposed in the first transition region 138 and contacts both first and third IC features 132 and 136. Particularly, the first SRR 140 includes a first end contacting the first IC feature 132 and a second end contacting the third IC feature 136. A first width cd and a second width W are similarly defined, as those in FIG. 1. A first spacing sp1 and a second spacing sp2 are similarly defined, as those in FIG. 1. In one embodiment, sp1<=2*cd. In another embodiment, sp2>=2*cd. In yet another embodiment, the first SRR 140 includes length L1 spanning from the first end to the second end, where L1>=1.2*cd. In the present embodiment, the first, second and third IC features are aligned in the first direction D1. The first SRR 140 is also aligned in the first direction D1. The various dimensions cd, W, sp1 and sp2 span in the second direction D2.

The IC pattern 130 further includes a fourth IC feature 142. The fourth IC feature 142 and the first segment of the second IC feature 134 forms a third dense pattern. The third dense pattern and the isolated pattern define a second transition region 144. A second SRR 146 is disposed in the second transition region 144 and contacts the fourth IC feature 142. The configuration of the second IC feature 134, the fourth IC feature 142 and the second SRR 146 is similar to the IC pattern 100, such as the one of FIG. 4. Similar dimensions are defined similarly, including the first width cd and the second width W, the first spacing sp1 and the second spacing sp2 of FIG. 1. Similar dimensional relationships or a subset present in various embodiments. In one embodiment, the second SRR 146 includes a length L2>=0.8*cd. In another embodiment, sp1<=2*cd. In yet another embodiment, sp2>=2*cd. In the present embodiment, the fourth IC feature 142 and the second SRR 146 are aligned in the first direction D1.

Figure 9:
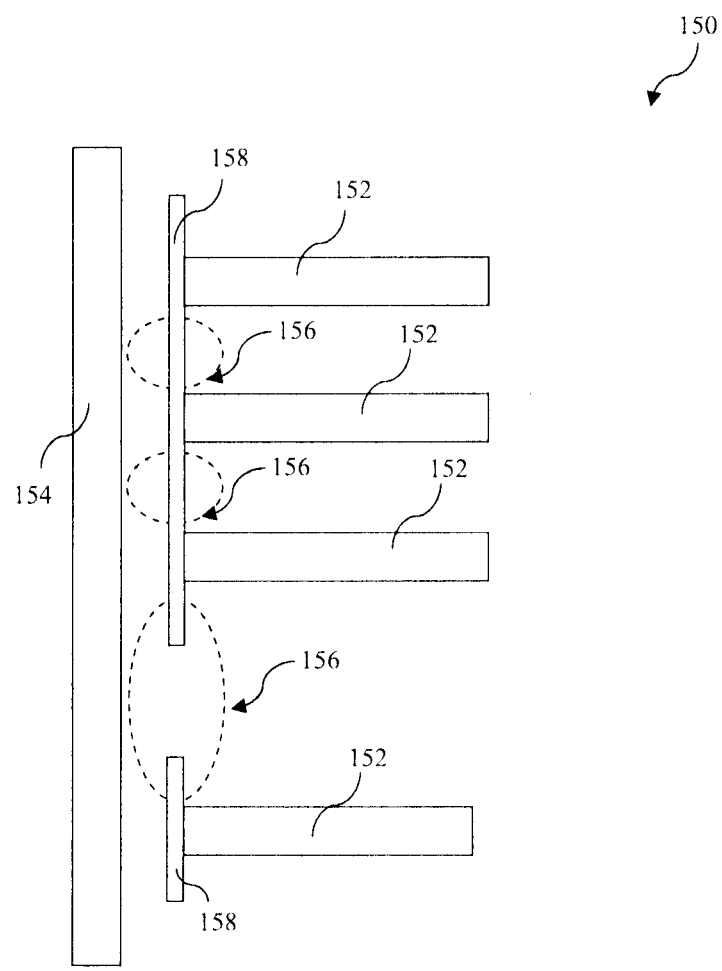
Figure 9:
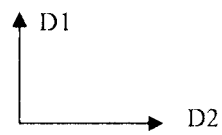

FIG. 9 provides another embodiment of an IC pattern 150 constructed according to various aspects of the present disclosure. The IC pattern 150 includes multiple first IC features 152 and a second IC feature 154. In the present embodiment, the first IC features 152 are aligned in the second direction D2 while the second IC feature 154 is aligned in the first direction D1. Each of the first IC features 152 and a portion of the second IC feature 154 form a dense pattern. The rest portions of the second IC feature 154 form isolated patterns. A dense pattern and a nearby isolated pattern define a transition region 156. Alternatively, two nearby dense patterns and a nearby isolated pattern define a transition region 156. Various SRRs 158 are disposed in the transition regions 156 and contact the corresponding first IC features 152, respectively. In one embodiment, a subset of the SRRs 158 are connected with each other and form a continuous feature. In one embodiment, a subset of the SRRs 158 are disconnected from the nearby SRRs. In the present embodiment, the first IC features 152 are aligned in the second direction D2, the second IC feature 154 is aligned in the first direction D1 and the SRRs 158 are aligned in the first direction D1.

In the IC pattern 150, similar dimensions (not shown for simplicity) are defined similarly, including the first width cd and the second width W, the first spacing sp1 and the second spacing sp2 of FIG. 1. For example, the first spacing sp1 is defined as the distance between the second IC feature and the corresponding first IC feature in the associated dense pattern. Similar dimensional relationships present in various embodiments. In one embodiment, $L>=0.8*cd$. In another embodiment, $sp1<=2*cd$. In yet another embodiment, $sp2>=2*cd$.

Figure 10:
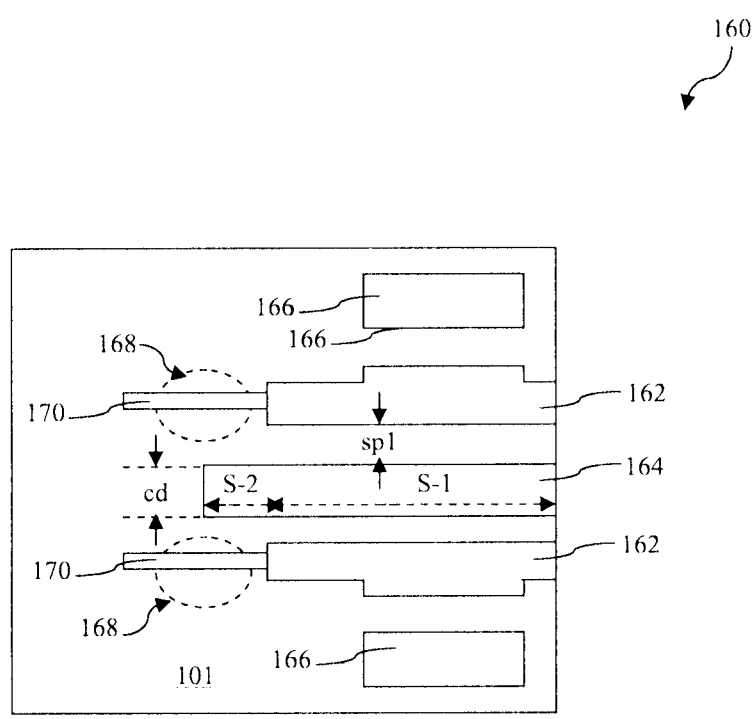
Figures 11, 12, 13:
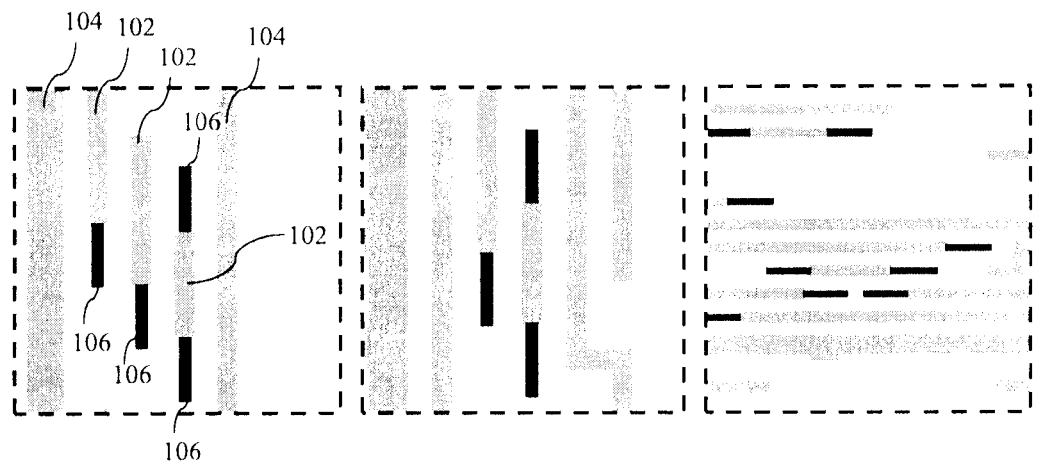
Figures 14, 15:

FIG. 10 provides another embodiment of an IC pattern 160 constructed according to various aspects of the present disclosure. The IC pattern 160 is formed or to be formed on a photomask 101, such as a fused quartz substrate. The IC pattern 160 includes first IC features 162 and a second IC feature 164 configured between the two first IC features. The second IC features 164 include a first segment S-1 proximate to the first IC features 162. The first IC features 162 and the first segment S-1 of the second IC feature form a dense pattern having a first pattern density. The second IC feature 164 further includes a second segment S-2 extended from the first segment S-1. The second segment S-2 is distant away from the first IC features 162 and forms an isolated pattern having a second pattern density less than the first pattern density. The IC pattern 160 further includes other IC features 166. Transition regions 168 are defined in areas from the dense patterns to the isolated pattern.

The IC pattern 160 includes sub-resolution rods (SRRs) 170 disposed in the transition region 168 and connected to the first IC features 162. The SRRs 170 are similar to the SRR 106 of FIG. 1 in terms of length and width. For example, a first spacing "sp1" is defined in the dense pattern and between the first and second IC features. The parameter "cd" is defined as the width of the second IC feature 164. In one embodiment, the length "L" of the SRR 170 is equal to or greater than 1.2 times of the width of the second IC feature 164, formulated as $L>=0.8*cd$. In another embodiment, the first spacing sp1 is less than or equal to the twice of the parameter cd, formulated as $sp1<=2*cd$.

FIGS. 11 to 15 provide various examples of an IC pattern having one or more sub-resolution rods (SRRs) disposed in the transition region(s), connected to the IC features, and configured to effectively adjust the pattern density of the transition region(s). As an example, the IC features 102, the second IC features 104 and the SRRs 106 are labeled in FIG. 11. The SRRs 106 are substantially similar to those SRRs in the previous embodiments in terms of width and length. Similarly, the IC patterns in FIGS. 12-15 each include various IC features and one or more SRRs. The SRRs are those features connected to the IC features but having substantial less width.

One or more of the following advantages and benefits may present in different embodiments of the disclosed IC structure having one or more sub-resolution rods. In one example, the line end necking issue is prevented and the processing window of dense-to-isolated transition region is improved by the SRR(s). In another example, the depth of focus (DOF) associated with lithography process is improved by the SRR(s). In one experiment, the SRRs having a pitch 90 nm create a dense environment and DOF is raised by 0.011 micron and reaches 0.1 micron.

Figure 16:
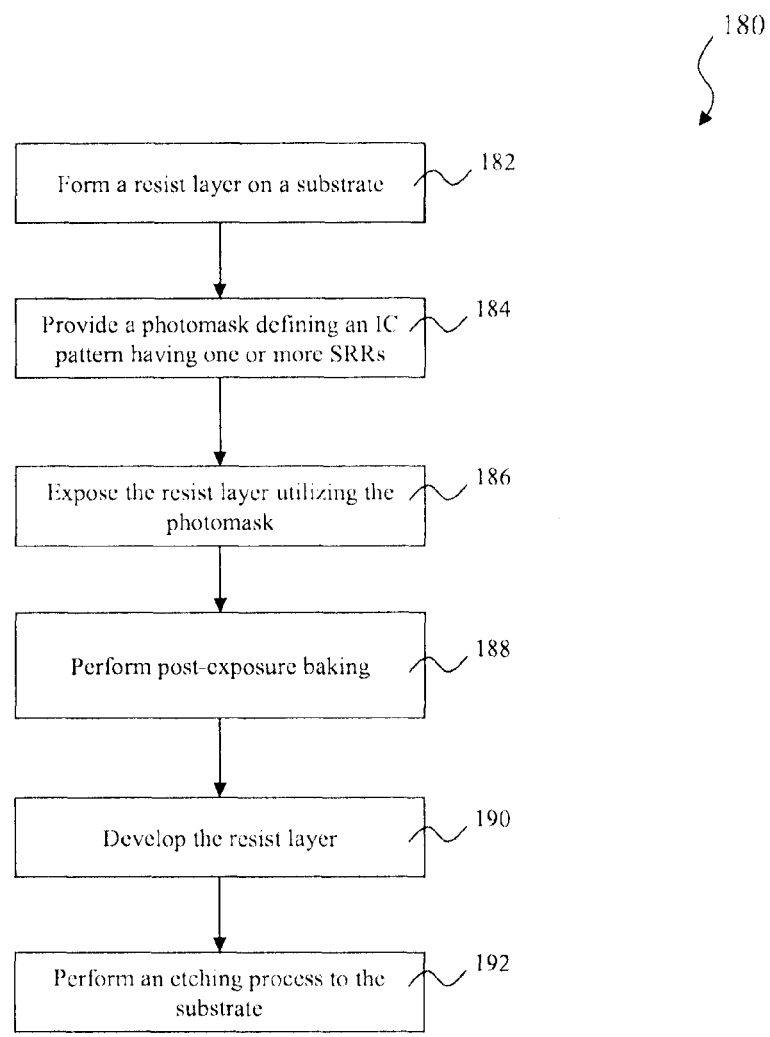
FIG. 16 is a flowchart of a method for lithography patterning constructed according to various aspects of the present disclosure in one embodiment.

FIG. 16 is a flowchart of a method 180 for patterning a device substrate using an IC pattern having one or more SRRs. The method 180 begins by forming a resist layer on the device substrate, such as a silicon wafer. The device substrate may alternatively be made of other suitable semiconductor material, including Ge, SiGe, or GaAs. Further, the device substrate may be made of another suitable elementary semiconductor, such as diamond; a suitable compound semiconductor, such as silicon carbide, indium arsenide, or indium phosphide; or a suitable alloy semiconductor, such as silicon germanium carbide, gallium arsenic phosphide, or gallium indium phosphide. The device substrate may include various doped regions, dielectric features, and multilevel interconnects. The device substrate may alternatively be a non-semiconductor material, such as a glass substrate for thin-film-transistor liquid crystal displ ay (TFT-LCD) devices. The device substrate may include one or more other material layers to be patterned, such as a polysilicon layer, a conductive layer, a dielectric layer, or multiple layers of various materials. In one example, the device substrate includes a hard mask layer to be patterned by a lithography process.

The resist layer formed on the device substrate is a radiation-sensitive resist layer, such as a photoresist layer. The resist layer is formed on the device substrate by a suitable technology, such as spin-on coating. In one embodiment, the coated resist layer is baked in a subsequent processing step, such as soft baking. The resist layer can be a positive-type or a negative-type resist. For advanced semiconductor patterning using an extreme ultraviolet (EUV) radiation beam, the resist layer may be a chemical amplification (CA) photoresist.

The method 180 proceeds to step 184 by providing a photomask defining an IC pattern having one or more sub-resolution rods (SRRs). The photomask includes a transparent substrate (or photomask substrate), such as a fused quartz substrate, according to one embodiment. In other embodiments, the IC pattern is formed on the photomask adopts a binary technology or phase-shift mask (PSM) technology. The IC pattern includes various IC features having various dense patterns and isolated patterns. One or more transition regions are defined in the areas spanned from one dense pattern to a nearby isolated pattern. One SRR is disposed in one transition region and connected to one IC feature. The SRR has a width less than the printable width of a lithography patterning process (an exposing process). In one embodiment, SRR includes a length being equal to or greater than 1.2 times of the width "cd" of the IC features (or critical dimension). In another embodiment, the dense spacing sp1 defined as a distance between two neighboring IC features in the corresponding dense pattern is less than or equal to twice of the width "cd", formulated as $sp1<=2*cd$. A second spacing (or isolated spacing) sp2 is similarly defined in the transition region as the second spacing sp2 of FIG. 1. In another embodiment, the isolated spacing sp2 is greater than or equal to twice of the cd, formulated as $sp2>=2*cd$.

Alternatively, a plurality of SRRs are disposed in the transition region and connected to one or more IC features. The SRRs are configured with a pitch such that the pattern density of the transition region is effectively and properly adjusted.

The method 180 proceeds to step 186 by performing an exposing process to the resist layer utilizing the photomask in a lithography tool, such as a scanner or stepper. For example, the exposing process may be carried out by exposing the resist layer with a radiation beam through the photomask. The radiation beam may be ultraviolet (UV) or extreme ultraviolet (EUV), such as a 248 nm beam from a krypton fluoride (KrF) excimer laser or a 193 nm beam from an argon fluoride (ArF) excimer laser. In an example, the resist layer includes photo-acid generator (PAG) that generates acid during the exposing process.

The method 180 may proceed to step 188 wherein the exposed resist layer is further treated by a baking process, such as a post exposure baking (PEB). During the PEB process, the resist layer is at a higher temperature. More acids are generated from the photo-generated acids through a chemical amplification process.

The method 180 proceeds to step 190 by performing a developing process to the resist layer, forming a patterned resist layer. During the developing process, a developing solution is applied to the resist layer. In one embodiment, the resist layer within the exposed regions is removed during the developing process. In another embodiment, the developing solution is a basic solution, such as tetramethyl ammonium hydroxide (TMAH).

Other semiconductor processes may be subsequently implemented using the patterned resist layer as a mask. In one embodiment, the method includes an etch step 192 that applies an etching process to the device substrate using the patterned resist layer as an etch mask. The pattern defined in the patterned resist layer is transferred to the device substrate by the etching process. More particularly, a material layer of the device substrate is etched through the openings of the patterned resist layer. In one example, the material layer is a polysilicon layer, a semiconductor layer, or a dielectric layer. In another example, the material layer is a hard mask layer, such as a silicon oxide layer or a silicon nitride layer. The etching process may utilize a wet etching solution, plasma gas, or a combination. In another embodiment, an ion implantation is applied to the device substrate using the patterned resist layer as an implantation mask. The patterned resist layer is removed by a wet stripping process or plasma ashing process after the etching process or the ion implantation.

The foregoing has outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A photomask, comprising:
    a first integrated circuit (IC) feature formed on a substrate;
    a plurality of second IC features formed on the substrate, so that each second IC feature is configured perpendicular to the first IC feature and parallel to each other second IC feature, an end portion of each second IC feature being proximate to the first IC feature, wherein a dense pattern is defined directly between the first IC feature and the end portions of the second IC features with a transition region defined as an area between two proximate second IC features and the first IC feature; and
    a sub-resolution rod (SRR) formed parallel to the first IC feature on the substrate, the SRR is disposed in the transition region, and the SRR is connected to at least the two proximate second IC features and is disposed between the first IC feature and the second IC features.

2. The photomask of claim 1, wherein the SRR is parallel to the first IC feature.

3. The photomask of claim 1, further comprising an additional SRR that is disposed in the transition region, the additional SRR is parallel to the first IC feature and coupled to an end portion of the one of the second IC features.

4. The photomask of claim 3, wherein the additional SRR is similar to the SRR in width, length, and orientation.

5. The photomask of claim 1, wherein
    the second IC feature includes a first width cd greater than a printable width defined as a minimum dimension printable to a photoresist layer during a lithography patterning process; and
    the SRR includes at least a second width W less than the printable width.

6. The photomask of claim 5, wherein the SRR includes a length L equal to or greater than 0.8 times of the first width cd.

7. The photomask of claim 5, wherein the dense pattern includes a first spacing sp1 between the first IC feature and second IC features, the first spacing sp1 being less than or equal to 2*cd.

8. The photomask of claim 5, wherein the SRR include a length L that is greater than or equal to 1.2*cd.

9. The photomask of claim 5, wherein a second spacing sp2 is defined in the transition region and the second spacing sp2 is extended from an isolated pattern of the second IC features to a nearby IC feature along a direction perpendicular to the second IC features, the second spacing sp2 being greater than or equal to 2*cd.

10. The photomask of claim 5, wherein the SRR includes a first end and a second end, the first end being connected to the first IC feature and the second end being spaced away from a nearby feature with a distance greater than the first width.

11. A photomask comprising an integrated circuit (IC) pattern, the IC pattern further comprising:
    a first IC feature;
    a second IC feature including a first segment and a second segment that extends from the first segment beyond an end of the first IC feature;
    a third IC feature, wherein the first segment and the first IC feature are configured proximate to each other and the first segment and the third IC feature are configured proximate to each other, the first IC feature, the first segment of the second IC feature, and the third IC feature together defining a dense pattern having a first pattern density, wherein the second segment forms an isolated pattern having a second pattern density less than the first pattern density;
    a first transition region defined between the first IC feature and the second segment;
    a second transition region defined between the third IC feature and the second segment; and
    at least one sub-resolution rod (SRR) that is disposed in the first transition region and the at least one SRR being connected to the first IC feature, the at least one SRR extending beyond an end of the second segment,
    wherein the dense pattern includes a spacing between the first IC feature and the first segment.

12. The photomask of claim 11, wherein the second IC feature includes a width cd; and the at least one SRR includes a length greater than or equal to 0.8 times of the width cd.

13. The photomask of claim 11, wherein the at least one SRR is perpendicular to the first IC feature.

14. The photomask of claim 11, wherein the at least one SRR is perpendicular to the second segment of the second IC feature.

15. The photomask of claim 11, further comprising at least one other SRR, the at least one other SRR being disposed within the second transition region.

16. The photomask of claim 15, wherein the at least one other SRR is connected to the third IC feature.

17. The photomask of claim 16, wherein the at least one other SRR is aligned parallel to the second segment of the second IC feature and extends beyond the end of the second segment.

* * * * *